(12) United States Patent
Horng

(10) Patent No.: US 6,869,824 B2
(45) Date of Patent: Mar. 22, 2005

(54) FABRICATION METHOD OF WINDOW-TYPE BALL GRID ARRAY SEMICONDUCTOR PACKAGE

(75) Inventor: Chih-Horng Horng, Hsinchu (TW)

(73) Assignee: Ultratera Corporation (TW)

(*) Notice: Subject to any disclaimer, the term of this patent is extended or adjusted under 35 U.S.C. 154(b) by 0 days.

(21) Appl. No.: 10/282,473

(22) Filed: Oct. 29, 2002

(65) Prior Publication Data

US 2004/0082114 A1 Apr. 29, 2004

(51) Int. Cl.[7] .................. H01L 21/44; H01L 23/495; H01L 29/40
(52) U.S. Cl. .................. 438/106; 438/108; 438/112; 438/113; 438/126; 438/127; 438/611; 438/613; 257/789; 257/668
(58) Field of Search .................. 438/611, 613, 438/106, 126, 127, 108, 112, 113; 257/789, 668

(56) References Cited

U.S. PATENT DOCUMENTS

| 6,476,507 B1 | * | 11/2002 | Takehara | 257/787 |
| 6,822,337 B2 | * | 11/2004 | Bai | 257/783 |
| 2001/0013642 A1 | * | 8/2001 | Jiang et al. | 257/676 |
| 2002/0130397 A1 | * | 9/2002 | Yew et al. | 257/666 |
| 2002/0171142 A1 | * | 11/2002 | Kinsman | 257/737 |
| 2002/0185751 A1 | * | 12/2002 | Choi et al. | 257/786 |
| 2003/0100174 A1 | * | 5/2003 | Chiu et al. | 438/612 |
| 2004/0061209 A1 | * | 4/2004 | Tsai et al. | 257/680 |

* cited by examiner

Primary Examiner—Carl Whitehead, Jr.
Assistant Examiner—James Mitchell
(74) Attorney, Agent, or Firm—Fulbright & Jaworski LLP

(57) ABSTRACT

A fabrication method of a window-type ball grid array (WBGA) semiconductor package is provided. With a chip being mounted over an opening formed through a substrate and electrically connected to the substrate by bonding wires through the opening, a molding process is performed to form a first encapsulant for encapsulating the chip. Then, a printing process is performed to form a second encapsulant for filling the opening and encapsulating the bonding wires. Finally, a plurality of solder balls are implanted on the substrate at area outside the second encapsulant. By implementing the molding process first and then the printing process, problems such as chip cracks, bond pad contamination and delamination generated in the prior art, can be eliminated.

14 Claims, 5 Drawing Sheets

FABRICATION METHOD OF WINDOW-TYPE BALL GRID ARRAY SEMICONDUCTOR PACKAGE

FIELD OF THE INVENTION

The present invention relates to fabrication methods of semiconductor packages, and more particularly, to a method for fabricating a window-type ball grid array (WBGA) semiconductor package, wherein a chip is mounted over an opening formed through a substrate and electrically connected to the substrate via the opening by bonding wires.

BACKGROUND OF THE INVENTION

A window-type ball grid array (WBGA) semiconductor package 1, as shown in FIG. 4, is a substrate-based structure in which a substrate 10 has an upper surface 100 and a lower surface 101 and is formed with an opening 102 penetrating through the same. A chip 11 is mounted via an adhesive 12 on the upper surface 100 of the substrate 10 in a face-down manner that, an active surface 110 of the chip 11 covers the opening 102 and partly exposed to the opening 102. A plurality of bonding wires 13 are formed through the opening 102 to electrically connect the partly-exposed active surface 110 of the chip 11 to the lower surface 101 of the substrate 10. Then, a molding process is performed to encapsulate the substrate 10 in a double-side manner that, an upper encapsulant 14 is formed on the upper surface 100 of the substrate 10 and encapsulates the chip 11, and a lower encapsulant 15 is formed on the lower surface 101 of the substrate 10 and encapsulates the opening 102 and bonding wires 13. Finally, a plurality of solder balls 16 are implanted on the lower surface 101 of the substrate 10 at area outside the lower encapsulant 15; this therefore completes fabrication of the WBGA semiconductor package 1.

A characteristic feature of the above window-type package structure 1 is to form the opening 102 through the substrate 10 for accommodating the bonding wires 13; this desirably shortens length of the bonding wires 13 and thus helps reduce overall package profile or thickness, such that electrical transmission or performances between the chip 11 and the substrate 10 can be efficiently implemented. During the molding process, an encapsulating mold, including an upper mold and a lower mold (not shown), is utilized; the upper and lower molds are designed in compliance with structural arrangement on the substrate 10 e.g. chip size, wire loops and substrate-opening size, so as to form appropriate upper and lower encapsulants 14, 15. The special mold design for fabricating the double-side molded structure would undesirably increase overall package fabrication costs.

In response to the above cost-increase problem, another conventional method for fabricating the WBGA semiconductor package 1' is provided as described with reference to FIGS. 5A–5C. Referring to FIG. 5A, the first step is to perform chip-bonding and wire-bonding processes as above for a substrate 10 formed with an opening 102, allowing a chip 11 to be mounted over the opening 102 on an upper surface 100 of the substrate 10 and electrically connected to a lower surface 101 of the substrate 10 by a plurality of bonding wires 13 formed through the opening 102. Then, a printing process is performed to form a lower encapsulant 15 on the lower surface 101 of the substrate 10 for filling the opening 102 and encapsulating the bonding wires 13.

Referring to FIG. 5B, after fabrication of the lower encapsulant 15, a molding process is performed to form an upper encapsulant 14 on the upper surface 100 of the substrate 10 for encapsulating the chip 11.

Finally, referring to FIG. 5C, with a plurality of solder balls 16 being implanted on the lower surface 101 of the substrate 10 at area outside the lower encapsulant 15, fabrication of the semiconductor package 1' is completed.

The printing technology utilized for forming the lower encapsulant 15 of the semiconductor package 1' may be desirably more cost-effective to implement than the molding process as previously discussed. However, during the molding process for fabricating the upper encapsulant 14 (as shown in FIG. 5B), the chip 11 suffers different supports at positions corresponding to the lower encapsulant 15 and a lower mold of an encapsulating mold (not shown) that abuts against the lower surface 101 of the substrate 10 at area outside the lower encapsulant 15, such that cracks of the chip 11 may be easily caused by mold-flow impact from an encapsulating resin used for forming the upper encapsulant 14, thereby undesirably degrading reliability and yield of fabricated package products.

Accordingly, there is provided a further conventional method for fabricating the WBGA semiconductor package 1" as described with reference to FIGS. 6A–6D. Referring to FIG. 6A, a substrate 10 formed with an opening 102 is mounted with a chip 11 via an adhesive 12 over the opening 102 on an upper surface 100 of the substrate 10. Then, a molding process is performed to form an upper encapsulant 14 on the upper surface 100 of the substrate 10 for encapsulating the chip 11.

Referring to FIG. 6B, after molding, a wire-bonding process is performed to form a plurality of bonding wires 13 for electrically connecting the chip 11 via the opening 102 to a lower surface 101 of the substrate 10.

Referring to FIG. 6C, a printing process is perform to form a lower encapsulant 15 on the lower surface 101 of the substrate 10 for filling the opening 102 and encapsulating the bonding wires 13.

Referring to FIG. 6D, finally, a plurality of solder balls 16 are implanted on the lower surface 101 of the substrate 10 at area outside the lower encapsulant 15, and thus, fabrication of the semiconductor package 1" is completed.

As the upper encapsulant 14 (by molding) is formed prior to the lower encapsulant 15 (by printing), the unbalanced supporting problem for the chip 11 can be eliminated without causing cracks of the chip 11. However, with the molding process being carried out before forming the bonding wires 13, bond pads 111 of the chip 11 are exposed to the opening 102 (as shown in FIG. 6A) and easily subject to contamination during molding; this thereby adversely affects subsequent wire-bonding quality. Moreover, during the wire-bonding process for forming the bonding wires 13, the substrate 10 mounted with the chip 11 is turned upside down, allowing an active surface 110 of the chip 11 to be exposed via the opening 102 and bonded with the bonding wires 13. A wire-bonder (not shown) is employed to firstly form studs on the bond pads 111 situated on the exposed active surface 110 of the chip 11, and then to draw from the studs to form the bonding wires 13 to be connected to the lower surface 101 of the substrate 10. However, stud formation usually induces a strong force applied from the wire-bonder to the chip 11; since the adhesive 12 for attaching the chip 11 to the substrate 10 undergoes twice curing processes respectively during application of the adhesive 12 and during molding for forming the upper encapsulant 14 and is thus reduced with its cushion effect, delamination may easily occur at interface between the twice-cured adhesive 12 and the chip 11 in response to the strong force applied from the wire-bonder during stud formation; delamination may undesirably cause leakage problems during tests of the semiconductor package 1".

Therefore, the problem to be solved herein is to provide a semiconductor package for preventing delamination and bond pad contamination as well as chip cracks, thereby assuring reliability and yield of fabricated package products.

SUMMARY OF THE INVENTION

A primary objective of the present invention is to provide a fabrication method of a window-type ball grid array (WBGA) semiconductor package, which can desirably prevent delamination and bond pad contamination as well as chip cracks from occurrence, thereby assuring reliability and yield of fabricated package products.

In accordance with the above and other objectives, the present invention proposes a fabrication method of a WBGA semiconductor package, comprising: preparing a substrate having an upper surface and a lower surface opposed to the upper surface, wherein at least an opening is formed to penetrate through the upper and lower surfaces; mounting at least a chip on the upper surface of the substrate via an adhesive, the chip having an active surface and a non-active surface opposed to the active surface, wherein the active surface of the chip covers the opening of the substrate in a manner as to expose a conductive area of the active surface to the opening; forming a plurality of bonding wires through the opening of the substrate for electrically connecting the conductive area of the chip to the lower surface of the substrate; performing a molding process to form a first encapsulant on the upper surface of the substrate for encapsulating the chip; performing a printing process to form a second encapsulant on the lower surface of the substrate for filling the opening and encapsulating the bonding wires; and implanting a plurality of solder balls on the lower surface of the substrate at area outside the second encapsulant.

The above package fabrication method provides significant benefits. By performing a wire-bonding process for forming the bonding wires prior to the molding process for forming the first encapsulant, bond pads of the chip bonded with the bonding wires would not be contaminated during molding. Further due to priority of the wire-bonding process, since the adhesive for attaching the chip to the substrate is merely cured once and still retains satisfactory cushion effect, therefore, delamination at interface between the adhesive and the chip can be prevented from occurrence when the chip suffers strong force from a wire-bonder for forming studs of the bonding wires on the bond pads. Moreover, by implementing the molding process prior to the printing process for forming the second encapsulant, the chip would not be subject to unbalanced supporting problems encountered in the prior art that performs the printing process first, such that the chip can be prevented from cracking and assured in structural intactness in the use of the package fabrication method of this invention

BRIEF DESCRIPTION OF THE DRAWINGS

The present invention can be more fully understood by reading the following detailed description of the preferred embodiments, with reference made to the accompanying drawings, wherein.

DETAILED DESCRIPTION OF THE PREFERRED EMBODIMENTS

Preferred embodiments for a fabrication method of a window-type ball grid array (WBGA) semiconductor package proposed in the present invention are described in more detail as follows with reference to FIGS. 1A–1F, 2A–2D and 3.

First Preferred Embodiment

FIGS. 1A–1F illustrate process steps involved in a fabrication method of a WBGA semiconductor package 2 according to a first preferred embodiment of the invention.

Figure 1A:
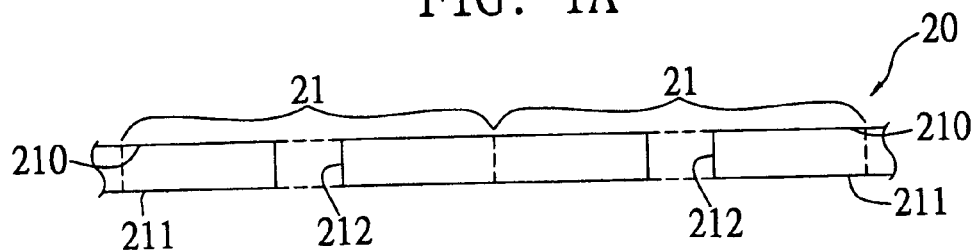
FIGS. 1A–1F are cross-sectional views showing process steps involved in a fabrication method of a window-type ball grid array (WBGA) semiconductor package according to a first preferred embodiment of the invention.

Referring to FIG. 1A, the first step is to prepare a substrate plate 20 integrally formed of a plurality of substrates 21 (as bordered by dotted lines shown in the drawing), wherein each of the substrates 21 has an upper surface 210 and a lower surface 211 opposed to the upper surface 210, and is formed with at least an opening 212 penetrating through the upper and lower surfaces 210, 211. The substrate plate 20 is primarily made of a conventional resin material such as epoxy resin, polyimide, BT resin, FR-4 resin, etc.

Figure 1B:
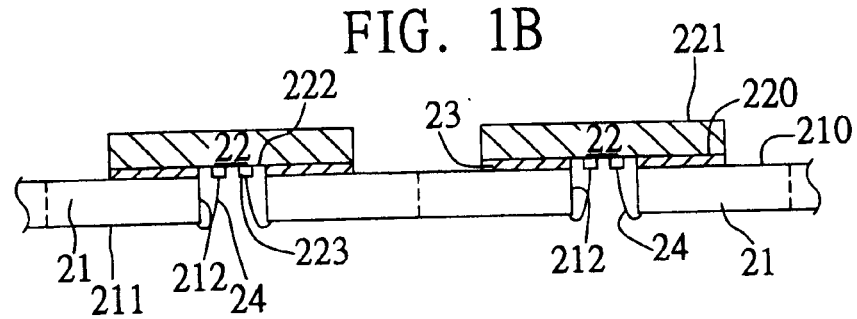

Referring to FIG. 1B, the next step is to mount at least a chip 22 on the upper surface 210 of each of the substrates 21. The chip 22 has an active surface 220 and a non-active surface 221 opposed to the active surface 220, and is mounted via an adhesive 23 on the corresponding one of the substrates 21 in a face-down manner that, the active surface 220 of the chip 22 completely covers the opening 212 of the corresponding substrate 21, and a conductive area 222 of the active surface 220 is exposed to the opening 212, so as to allow a plurality of bond pads 223 formed on the conductive area 222 to be exposed via the opening 212 and subject to a subsequent wire-bonding process.

Optionally, a non-conductive material (not shown) can be used to facilitate complete attachment of the chip 22 to the substrate 21. With the chip 22 being mounted on the substrate 21 by the adhesive 23, there may be formed gaps (not shown) between the chip 22 and the substrate 21 at area uncovered by the adhesive 23 and adjacent to the opening 212 of the substrate 21; such gaps are preferably sealed with the non-conductive material by a dispensing process, whereby the chip 22 can be firmly supported on the substrate 22 so as to prevent cracks of the chip 22 from occurrence during a subsequent molding process.

Then, a wire-bonding process is performed to form a plurality of bonding wires 24 e.g. gold wires through the opening 212 of each of the substrates 21. The bonding wires 24 are bonded to the exposed bond pads 223 formed on the chip 22, and thus electrically connect the conductive area 222 of the active surface 220 of the chip 22 to the lower surface 211 of the corresponding one of the substrates 21. It should be noted that, the above optional gap-sealing process can be alternatively implemented after the wire-bonding process but should be performed prior to a subsequent molding process.

Figure 1C:
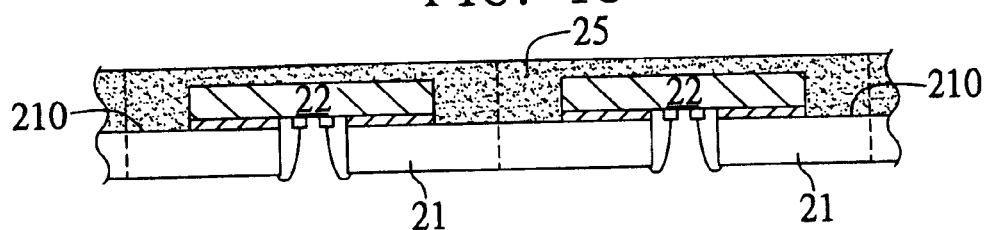

Referring to FIG. 1C, a molding process is performed to form a first encapsulant 25 on the upper surfaces 210 of the substrates 21, so as to encapsulate all the chips 22 mounted on the substrates 21 by means of the first encapsulant 25.

Figure 1D:
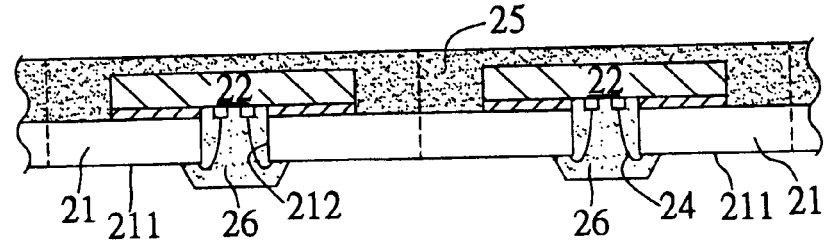

Referring to FIG. 1D, a printing process is performed to form a second encapsulant 26 on the lower surface 211 of each of the substrates 21, wherein each second encapsulant 26 completely fills the opening 212 and encapsulates the bonding wires 24 for the corresponding one of the substrates 21. The second encapsulant 26 may be made of a resin material different from that for fabricating the first encapsulant 25.

Figure 1E:
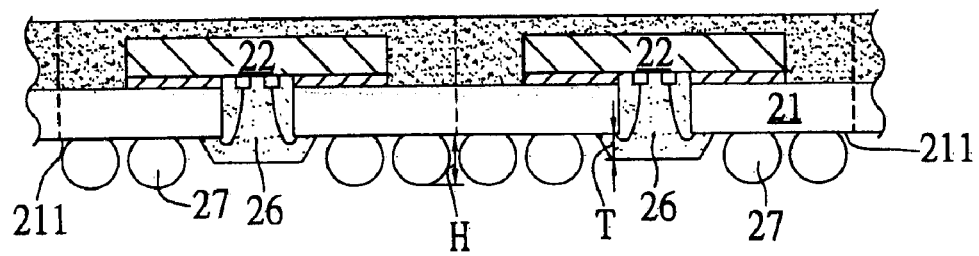

Referring to FIG. 1E, a ball-implanting process is performed to implant a plurality of solder balls 27 on the lower surface 211 of each of the substrates 21 at area outside the second encapsulant 26. Height H of the solder balls 27 is greater than thickness T of the second encapsulant 26 protruding from the lower surface 211 of the substrate 21. The solder balls 27 serve as I/O (input/output) ports for electrically connecting the chip 22 to an external device such as a printed circuit board (PCB).

Figure 1F:
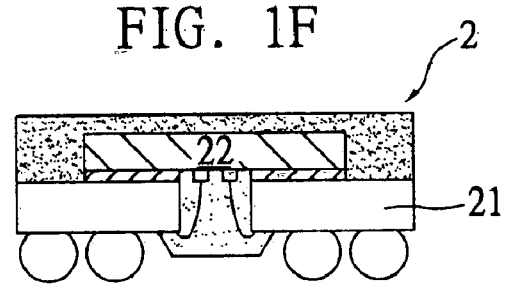

Referring to FIG. 1F, finally, a singulating process is performed to cut into the first encapsulant 25 and separate apart the plurality of substrates 21 along the dotted lines shown in FIG. 1E, such that a plurality of individual semiconductor packages 2 are fabricated.

Second Preferred Embodiment

FIGS. 2A–2D illustrate process steps involved in the fabrication method of a WBGA semiconductor package 2' according to a second preferred embodiment of the invention. This embodiment is similar to the above first embodiment, and thus, same elements are designated by same reference numerals as above.

Figure 2A:
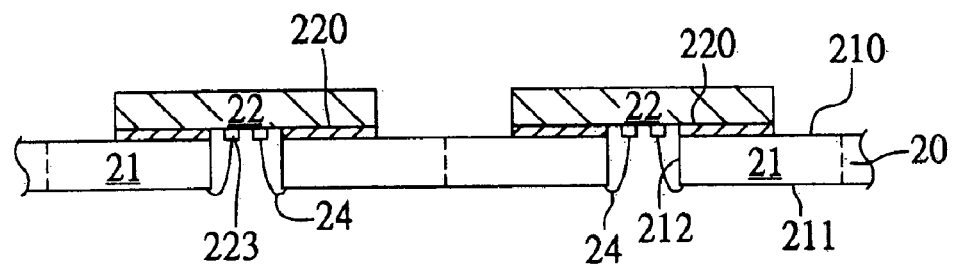
FIGS. 2A–2D are cross-sectional views showing process steps involved in the fabrication method of a WBGA semiconductor package according to a second preferred embodiment of the invention.

Referring to FIG. 2A, the first step is to prepare a substrate plate 20 integrally formed of a plurality of substrates 21 (as bordered by dotted lines shown in the drawing), wherein each of the substrates 21 is formed with at least an opening 212 penetrating through a upper and a lower surfaces 210, 211 of the substrate 21.

A chip-bonding process and a wire-bonding process are performed as described above with reference to FIG. 1B. At least a chip 22 is mounted on the upper surface 210 of each of the substrates 21 in a face-down manner that, an active surface 220 of the chip 21 covers the opening 212 of the corresponding substrate 21, and a plurality of bond pads 223 formed on the active surface 220 are exposed via the opening 212.

Then, a plurality of bonding wires 24 are formed through the opening 212 of each of the substrates 21, and bonded to the exposed bond pads 223 for electrically connecting the active surface 220 of the chip 22 to the lower surface 211 of the corresponding one of the substrates 21.

Figure 2B:
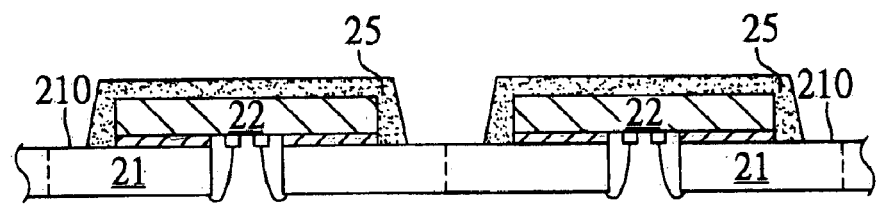

Referring to FIG. 2B, a molding process is performed to form a first encapsulant 25 on the upper surface 210 of each of the substrates 21, wherein each first encapsulant 25 completely encapsulates the corresponding one of the chips 22 mounted on the substrates 21.

Figure 2C:
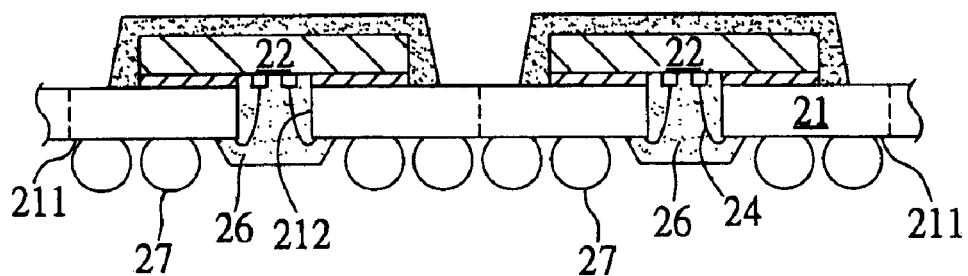

Referring to FIG. 2C, a printing process is performed to form a second encapsulant 26 on the lower surface 211 of each of the substrates 21, wherein each second encapsulant 26 completely fills the opening 212 and encapsulates the bonding wires 24 for the corresponding one of the substrates 21.

Then, a plurality of solder balls 27 are implanted on the lower surface 211 of each of the substrates 21 at area outside the second encapsulant 26, and serve as I/O (input/output) ports for mediating external electrically connection for the chip 22.

Figure 2D:
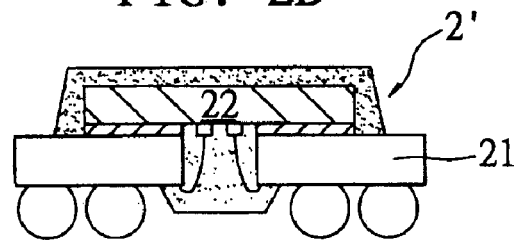

Referring to FIG. 2D, a singulating process is performed to cut apart the plurality of substrates 21 along the dotted lines shown in FIG. 2C, so as to form a plurality of individual semiconductor packages 2'.

Third Preferred Embodiment

Figure 3:
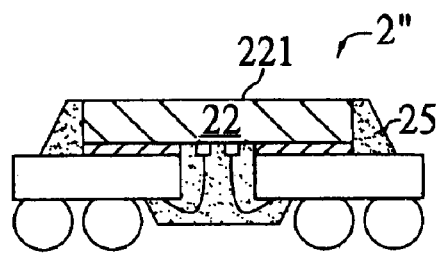
FIG. 3 is a cross-sectional view of a WBGA semiconductor package according to a third preferred embodiment of the invention.
Figure 4:
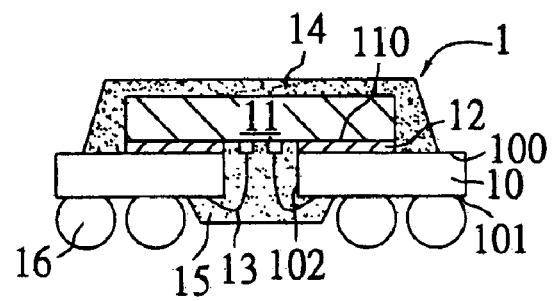
FIG. 4 (PRIOR ART) is a cross-sectional view of a conventional WBGA semiconductor package.
Figure 5A:
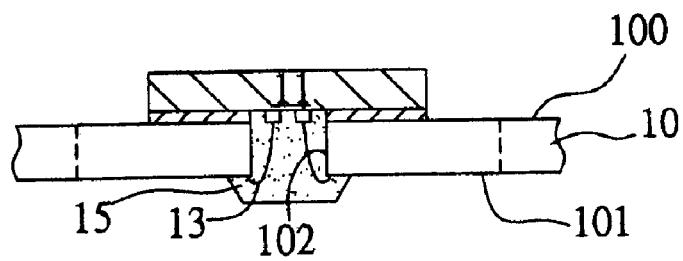
FIGS. 5A–5C (PRIOR ART) are cross-sectional views showing process steps involved in another conventional fabrication method of a WBGA semiconductor package.
Figure 5B:
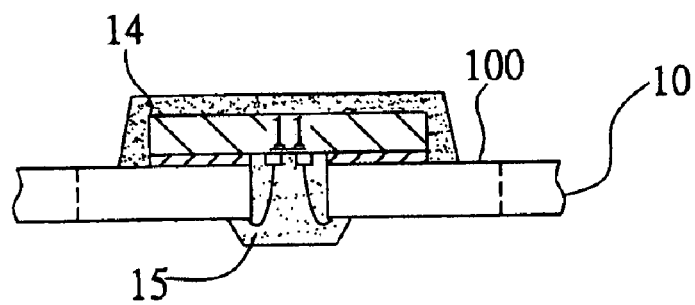
Figure 5C:
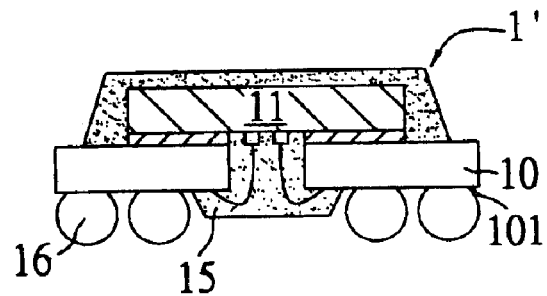
Figure 6A:
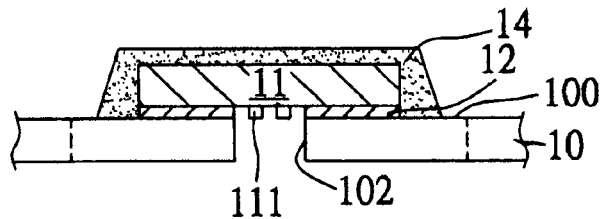
FIGS. 6A–6D (PRIOR ART) are cross-sectional views showing process steps involved in a further conventional fabrication method of a WBGA semiconductor package.
Figure 6B:
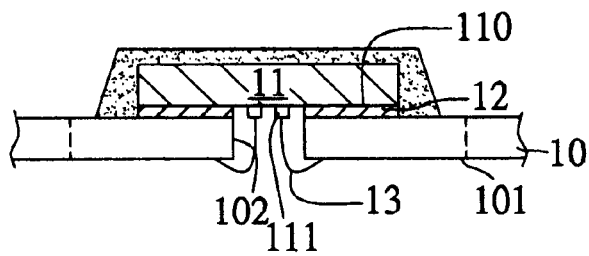
Figure 6C:
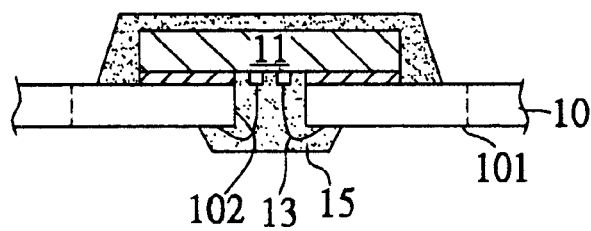
Figure 6D:
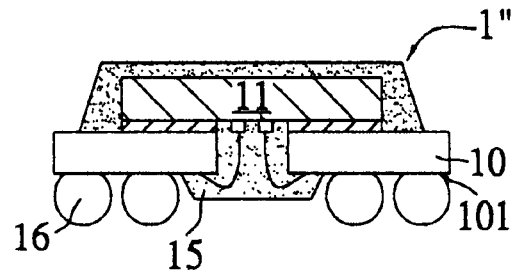

FIG. 3 illustrates a WBGA semiconductor package 2" according to a third preferred embodiment of the invention. This semiconductor package 2" can be made by the above fabrication methods described in the first and second embodiments, and differs from the above package structures 2, 2' in that, the non-active surface 221 of the chip 22 in this semiconductor package 2" is exposed to outside of the first encapsulant 25 that encapsulates the chip 22. This structural arrangement facilitates dissipation of heat generated from operation of the chip 22 via the exposed non-active surface 221 of the chip 22, such that heat dissipating efficiency can be improved.

In conclusion, the above package fabrication methods provide significant benefits. By performing the wire-bonding process prior to the molding process for forming the first encapsulant 25, bond pads 223 of the chip 22 bonded with the bonding wires 24 would not be contaminated during molding. Further due to priority of the wire-bonding process, since the adhesive 23 for attaching the chip 22 to the substrate 21 is merely cured once and still retains satisfactory cushion effect, therefore, delamination at interface between the adhesive 23 and the chip 22 can be prevented from occurrence when the chip 22 suffers strong force from a wire-bonder for forming studs of the bonding wires 24 on the bond pads 223. Moreover, by implementing the molding process prior to the printing process for forming the second encapsulant 26, the chip 22 would not be subject to unbalanced supporting problems encountered in the prior art that performs the printing process first, such that the chip 22 can be prevented from cracking and assured in structural intactness in the use of the package fabrication method of this invention.

The invention has been described using exemplary preferred embodiments. However, it is to be understood that the scope of the invention is not limited to the disclosed embodiments. On the contrary, it is intended to cover various modifications and similar arrangements. The scope of the claims, therefore, should be accorded the broadest interpretation so as to encompass all such modifications and similar arrangements.

What is claimed is:

1. A fabrication method of a window-type ball grid array semiconductor package, comprising the steps of:

(1) preparing a substrate having an upper surface and a lower surface opposed to the upper surface, wherein at least an opening is formed to penetrate through the upper and lower surfaces, and then proceeding to step (2);

(2) mounting at least a chip on the upper surface of the substrate via an adhesive, the chip having an active surface and a non-active surface opposed to the active surface, wherein the active surface of the chip covers the opening of the substrate in a manner as to expose a conductive area of the active surface to the opening, and then proceeding to step (3);

(3) forming a plurality of bonding wires through the opening of the substrate for electrically connecting the conductive area of the chip to the lower surface of the substrate, and then proceeding to step (4);

(4) performing a molding process to form a first encapsulant on the upper surface of the substrate for encapsulating the chip, and then proceeding to step (5);

(5) performing a printing process to form a second encapsulant on the lower surface of the substrate for filling the opening and encapsulating the bonding wires, and then proceeding to step (6); and (6) implanting a plurality of solder balls on the lower surface of the substrate at area outside the second encapsulant.

2. The fabrication method of claim 1, wherein the chip is formed with a plurality of bond pads on the conductive area of the active surface thereof, allowing the bond pads to be exposed via the opening of the substrate.

3. The fabrication method of claim 2, wherein the bonding wires are bonded to the exposed bond pads of the chip.

4. The fabrication method of claim 1, wherein the chip is dimensioned to completely cover the opening of the substrate.

5. The fabrication method of claim 1, wherein the first and second encapsulants are made of different materials.

6. The fabrication method of claim 1, wherein the non-active surface of the chip is exposed to outside of the first encapsulant.

7. The fabrication method of claim 1, wherein, height of the solder balls is greater than thickness of the second encapsulant protruding from the lower surface of the substrate.

8. A fabrication method of a window-type ball grid array semiconductor package, comprising the steps of:

(1) preparing a substrate plate integrally formed of a plurality of substrates, wherein each of the substrates has an upper surface and a lower surface opposed to the upper surface, and is formed with at least an opening penetrating through the upper and lower surfaces, and then proceeding to step (2);

(2) mounting at least a chip on the upper surface of each of the substrates via an adhesive, the chip having an active surface and a non-active surface opposed to the active surface, wherein the active surface of the chip covers the opening of the corresponding one of the substrates in a manner as to expose a conductive area of the active surface to the opening, and then proceeding to step (3);

(3) forming a plurality of bonding wires through the opening of each of the substrates for electrically connecting the conductive area of the chip to the lower surface of the corresponding one of the substrates, and then proceeding to step (4);

(4) performing a molding process to form a first encapsulant on the upper surfaces of the substrates for encapsulating the chips, and then proceeding to step (5);

(5) performing a printing process to form a second encapsulant on the lower surface of each of the substrates for filling the opening and encapsulating the bonding wires, and then proceeding to step (6);

(6) implanting a plurality of solder balls on the lower surface of each of the substrates at area outside the second encapsulant, and then proceeding to step (7); and (7) performing a singulating process to cut into the first encapsulant and separate apart the plurality of substrates, so as to form a plurality of individual semiconductor packages.

9. The fabrication method of claim 8, wherein the chip is formed with a plurality of bond pads on the conductive area of the active surface thereof, allowing the bond pads to be exposed via the opening of the substrate.

10. The fabrication method of claim 9, wherein the bonding wires are bonded to the exposed bond pads of the chip.

11. The fabrication method of claim 8, wherein the chip is dimensioned to completely cover the opening of the substrate.

12. The fabrication method of claim 8, wherein the first and second encapsulants are made of different materials.

13. The fabrication method of claim 8, wherein the non-active surfaces of the chips are exposed to outside of the first encapsulant.

14. The fabrication method of claim 8, wherein height of the solder balls is greater than thickness of the second encapsulant protruding from the lower surface of the substrate.

* * * * *